(12) United States Patent
Liu et al.

(10) Patent No.: US 10,944,007 B2
(45) Date of Patent: Mar. 9, 2021

(54) SILICON ON INSULATOR SEMICONDUCTOR DEVICE WITH MIXED DOPED REGIONS

(71) Applicant: Taiwan Semiconductor Manufacturing Co., Ltd., Hsin-Chu (TW)

(72) Inventors: Jack Liu, Taipei (TW); Charles Chew-Yuen Young, Cupertino, CA (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/578,301

(22) Filed: Sep. 21, 2019

(65) Prior Publication Data

US 2020/0020809 A1 Jan. 16, 2020

Related U.S. Application Data

(62) Division of application No. 15/992,766, filed on May 30, 2018, now Pat. No. 10,535,775.

(51) Int. Cl.
*H01L 29/786* (2006.01)
*H01L 27/12* (2006.01)
(Continued)

(52) U.S. Cl.
CPC .... *H01L 29/78603* (2013.01); *H01L 21/8238* (2013.01); *H01L 21/84* (2013.01);
(Continued)

(58) Field of Classification Search
CPC ......... H01L 29/78603; H01L 29/78615; H01L 27/1203; H01L 27/092; H01L 21/8238
See application file for complete search history.

(56) References Cited

U.S. PATENT DOCUMENTS 8,653,596 B2 2/2014 Cheng et al.
2009/0134468 A1 5/2009 Tsuchiya et al.
(Continued)

OTHER PUBLICATIONS

Tech Design Forum. "DVFS and Body Bias." Retrieved online on Mar. 29, 2018 from http://www.techdesignforums.com/practice/guides/dvfs-body-back-bias/.
(Continued)

*Primary Examiner* — Matthew L Reames
(74) *Attorney, Agent, or Firm* — Eschweiler & Potashnik, LLC

(57) ABSTRACT

In some embodiments, a semiconductor device is provided. The semiconductor device includes a semiconductor substrate having a first semiconductor material layer separated from a second semiconductor material layer by an insulating layer. A source region and a drain region are disposed in the first semiconductor material layer and spaced apart. A gate electrode is disposed over the first semiconductor material layer between the source region and the drain region. A first doped region having a first doping type is disposed in the second semiconductor material layer, where the gate electrode directly overlies the first doped region. A second doped region having a second doping type different than the first doping type is disposed in the second semiconductor material layer, where the second doped region extends beneath the first doped region and contacts opposing sides of the first doped region.

20 Claims, 12 Drawing Sheets

(51) Int. Cl.
*H01L 29/40* (2006.01)
*H01L 27/092* (2006.01)
*H01L 23/535* (2006.01)
*H01L 21/84* (2006.01)
*H01L 21/8238* (2006.01)
*H01L 29/06* (2006.01)

(52) U.S. Cl.
CPC .......... *H01L 23/535* (2013.01); *H01L 27/092* (2013.01); *H01L 27/1203* (2013.01); *H01L 29/0646* (2013.01); *H01L 29/402* (2013.01); *H01L 29/78615* (2013.01); *H01L 21/823892* (2013.01)

(56) References Cited

U.S. PATENT DOCUMENTS

| | | | | |
|---|---|---|---|---|
| 2010/0237424 | A1* | 9/2010 | Cheng | H01L 21/823842 257/369 |
| 2012/0091531 | A1* | 4/2012 | Baldwin | H01L 27/0207 257/368 |
| 2012/0261792 | A1* | 10/2012 | Cheng | H01L 21/743 257/510 |

OTHER PUBLICATIONS

Non-Final Office Action dated Jun. 7, 2019 for U.S. Appl. No. 15/992,766.
Notice of Allowance dated Nov. 20, 2019 for U.S. Appl. No. 15/992,766.

* cited by examiner

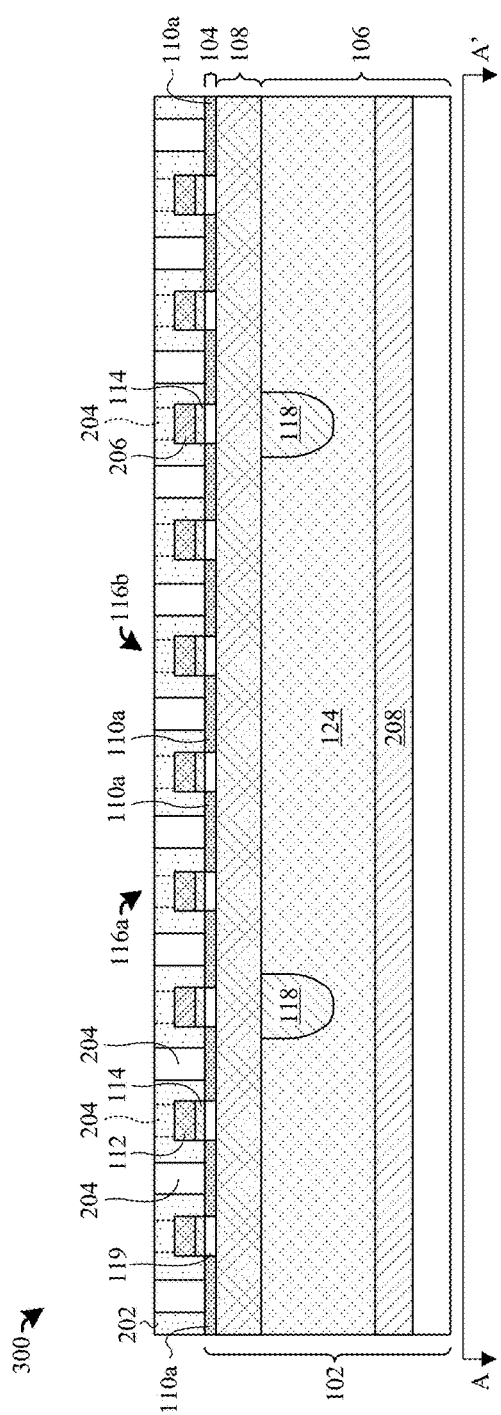
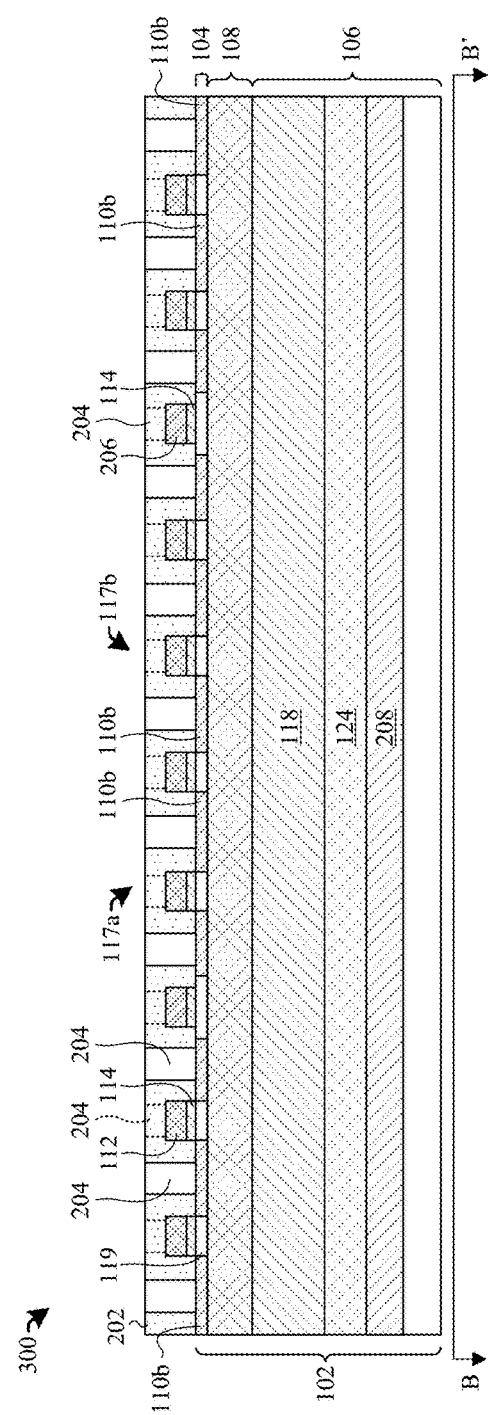
Fig. 3B
Fig. 3C

SILICON ON INSULATOR SEMICONDUCTOR DEVICE WITH MIXED DOPED REGIONS

REFERENCE TO RELATED APPLICATION

This Application is a Divisional of U.S. application Ser. No. 15/992,766, filed on May 30, 2018, the contents of which are hereby incorporated by reference in their entirety.

BACKGROUND

Semiconductor devices are electronic components that exploit electronic properties of semiconductor materials to affect electrons or their associated fields. A widely used type of semiconductor device is metal-oxide-semiconductor field-effect transistor (MOSFET). Semiconductor devices have traditionally been formed on bulk semiconductor substrates. In recent years, semiconductor-on-insulator (SOI) substrates have emerged as an alternative to bulk semiconductor substrates. An SOI substrate comprises a first semiconductor material layer, an insulating layer overlying the first semiconductor material layer, and a second semiconductor material layer overlying the insulating layer. Among other things, an SOI substrate leads to reduced parasitic capacitance, reduced leakage current, reduced latch up, and improved semiconductor device performance (e.g., lower power consumption and higher switching speed).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3C illustrate various views of some embodiments of an integrated chip (IC) having multiple doped regions disposed beneath a plurality of gate electrodes arranged over a semiconductor substrate.

DETAILED DESCRIPTION

Figures 1A, 1B, 1C:
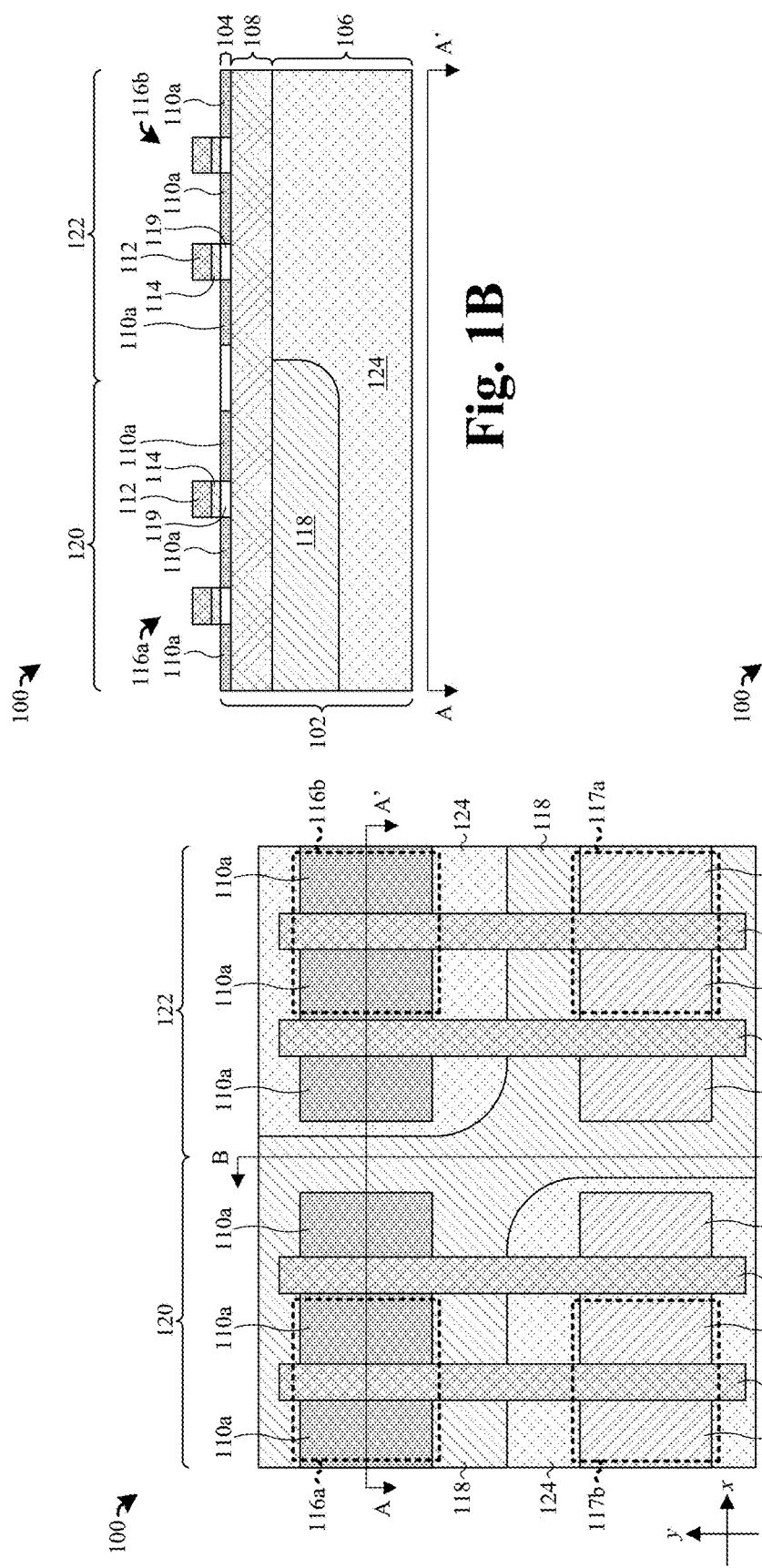
FIGS. 1A-1C illustrate various views of some embodiments of an integrated chip (IC) having multiple doped regions disposed beneath a plurality of gate electrodes arranged over a semiconductor substrate.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some metal-oxide-semiconductor field-effect transistors (MOSFETs) are disposed over/within a semiconductor-on-insulator (SOI) substrate. The SOI substrate comprises an insulating layer vertically separating a first semiconductor material layer from a second semiconductor material layer. The MOSFET comprises a pair of source/drain regions, a selectively-conductive channel, a gate dielectric, and a gate electrode. The source/drain regions are disposed in the first semiconductor material layer and laterally spaced. The selectively-conductive channel is disposed in the first semiconductor material layer and extends laterally from one of the source/drain regions to another one of the source/drain regions. The gate dielectric layer and the gate electrode are arranged between the source/drain regions and are disposed over the selectively-conductive channel. By applying different electric potentials to the gate electrode, the behavior of the MOSFET may be controlled.

Further, a well region having a doping type is disposed in the second semiconductor material layer underlying the selectively-conductive channel. By applying an electric potential to the well region, the behavior of the MOSFET may further be controlled. For example, by applying a positive electric potential to the well region (w.g., of a p-channel device), the switching speed of the MOSFET may be increased. The greater the positive electric potential applied to the well region; the greater the increase in switching speed. On the other hand, by applying a negative electric potential to the well region, leakage current may be reduced. The greater the negative electric potential applied to the well region; the greater reduction in leakage current.

The amount of positive electric potential and negative electric potential that may be applied to the well region is determined by the doping type of the well region in relation to the doping type of the overlying source/drain regions. For a fast switching MOSFET, the well region may be doped with a same doping type as the source/drain regions (e.g., a "flip well" structure). However, this doping configuration reduces the amount of negative electric potential that may be applied to the well region, and thus reduces the effectiveness of the well region to reduce leakage current. On the other hand, for a low leakage current MOSFET, the well region may be doped with a different doping type than the source/drain regions (e.g., a "conventional well" structure). However, this doping configuration reduces the amount of positive electric potential that may be applied to the well region, and thus reduces the effectiveness of the well region to increase switching speed. In an effort to take advantage of both fast switching MOSFETs and low leakage current MOSFETs, manufactures have attempted to form an integrated chip (IC) having both fast switching MOSFETs (e.g., having a well region with the same doping type as overlying source/drain regions) and low leakage current MOSFETs (e.g., having a well region with a different doping type than overlying source/drain regions) on an SOI substrate.

One challenge with forming an IC on a SOI substrate with both fast switching MOSFETs and low leakage current MOSFETs is that typical place and route tools cause the differently doped well regions to become regionally discontinuous (e.g., a region of the IC having differently doped well regions that are discontinuous), and thus forms floating well regions in regions of the IC (e.g., a graphic processing unit (GPU) region, a central processing unit (CPU) region, a memory region, etc.). Floating well regions may degrade performance of the MOSFETs by increasing negative effects (e.g., short channel effects and/or history effect) that hinder MOSFET performance on an SOI substrate. One approach to overcoming the floating well regions is to incorporate a body contact for each floating well region. However, a large area of the SOI substrate, which may be used to increase the density of the MOSFETs disposed on the SOI substrate, is consumed by incorporating a body contact for each floating well region. Another possible approach is to group the fast switching MOSFETs together in a first region of the SOI substrate (e.g., a region of the SOI substrate comprising a CPU), and group the low leakage current MOSFETs together in a second region of the SOI substrate (e.g., a region of the SOI substrate comprising a GPU). However, by grouping the different types of MOSFETs in separate regions of the SOI substrate, the ability to optimize the power and/or timing of the IC may be limited.

Therefore, various embodiments of the present disclosure are directed toward a semiconductor device having multiple doped regions disposed beneath source/drain regions of the semiconductor device to optimize an integrated chip (IC) performance without incurring the area penalty associated with increased body contacts. In various embodiments, an SOI substrate comprises a first semiconductor material layer vertically separated from a second semiconductor material layer by an insulating layer. A first gate electrode and a second gate electrode are disposed over the first semiconductor material layer. A first doped region is disposed in the second semiconductor material layer and underlies the first gate electrode in a vertical direction. A second doped region having a different doping type than the first doped region is disposed in the second semiconductor material layer and underlies both the first gate electrode and the second gate electrode in the vertical direction. The second doped region extends beneath the first doped region vertically beneath the gate electrode and contacts a sidewall of the first doped region between the first gate electrode and the second gate electrode. By having the second doped region extend beneath the first doped region, both the first doped region and the second doped region can continuously extend below multiple discrete device regions.

FIGS. 1A-1C illustrate various views of some embodiments of an integrated chip (IC) 100 having multiple doped regions disposed beneath a plurality of gate electrodes arranged over a semiconductor substrate 102. FIG. 1A illustrates a top view of some embodiments of the IC 100. FIG. 1B illustrates a cross-sectional view of some embodiments of a region of the IC 100 taken along line A-A' of FIG. 1A. FIG. 1C illustrates a cross-sectional view of some embodiments of a region of the IC 100 taken along line B-B' of FIG. 1A.

As shown in FIGS. 1A-1C, the IC 100 comprises a semiconductor substrate 102. The semiconductor substrate 102 comprises a first semiconductor material layer 104 vertically separated from a second semiconductor material layer 106 by an insulating layer 108. In various embodiments, the semiconductor substrate 102 is a semiconductor-on-insulator (SOI) substrate. In some embodiments, the semiconductor substrate 102 may be a fully-depleted semiconductor-on-insulator (FDSOI) substrate that comprises a first semiconductor material layer 104 having a first semiconductor material thickness. In further embodiments, the semiconductor substrate 102 may be a partially-depleted semiconductor-on-insulator (PDSOI) that comprises a first semiconductor material 104 having a second semiconductor material thickness that is greater than the first semiconductor material thickness. In further embodiments, the first semiconductor material layer 104 may comprise an intrinsic semiconductor material (e.g., undoped silicon). In other such embodiments, the first semiconductor material layer 104 may comprise a doped semiconductor material (e.g., p-type doped silicon).

First source/drain regions 110a are disposed in the first semiconductor material layer 104. The first source/drain regions 110a are laterally spaced from one another in a first direction (e.g., along an x-axis). In some embodiments, the first source/drain regions 110a may comprise a first doping type (e.g., p-type doping).

Second source/drain regions 110b are disposed in the first semiconductor material layer 104. The second source/drain regions 110b are laterally spaced from one another in the first direction. In some embodiments, the second source/drain regions 110b are respectively spaced from the first source/drain regions 110a in a second direction (e.g., along a y-axis) transverse the first direction. In further embodiments, the second source/drain regions 110b may comprise a second doping type (e.g., n-type doping) different than the first doping type.

Gate electrodes 112 are disposed over the first semiconductor material layer 104. Individual gate electrodes 112 are disposed between neighboring first source/drain regions 110a and neighboring second source/drain regions 110b. In some embodiments, the gate electrodes 112 continuously extend in the second direction between neighboring first source/drain regions 110a and respective neighboring second source/drain regions 110b. Gate dielectrics 114 respectively underlie the gate electrodes 112 and separate the gate electrodes 112 from the first semiconductor material layer 104.

In various embodiments, p-type channel metal-oxide-semiconductor field-effect (PMOS) transistors 116a-116b respectively comprise neighboring first source/drain regions 110a disposed in the first semiconductor material layer 104, an individual gate electrode 112 disposed over the first semiconductor material layer 104 between the neighboring first source/drain regions 110a, and an individual gate dielectric 114 disposed between the neighboring first source/drain regions 110a and separating the individual gate electrode 112 from the first semiconductor material layer 104. For clarity in the figures, only two PMOS transistors 116a-116b are labeled. During operation of the PMOS transistors 116a-116b, channel regions 119 are respectively formed between the neighboring first source/drain regions 110a. In various embodiments, the channel regions 119 may comprise respective portions of the first semiconductor material layer 104 having a doping type opposite (e.g., n-type doping) the doping type of the neighboring first source/drain regions 110a.

In some embodiments, n-type channel metal-oxide-semiconductor field-effect (NMOS) transistors 117a-117b respectively comprise neighboring second source/drain regions 110b disposed in the first semiconductor material layer 104, an individual gate electrode 112 disposed over the first semiconductor material layer 104 between the neighboring second source/drain regions 110b, and an individual gate dielectric 114 disposed between the neighboring second source/drain regions 110b and separating the individual gate electrode 112 from the first semiconductor material layer 104. For clarity in the figures, only two NMOS transistors 117a-117b are labeled. During operation of the NMOS transistors 117a-117b, channel regions 119 are respectively formed between the neighboring second source/drain regions 110b. In various embodiments, the channel regions 119 may comprise respective portions of the first semiconductor material layer 104 having a doping type opposite (e.g., p-type doping) the doping type of the neighboring second source/drain regions 110b.

In further embodiments, a first PMOS transistor 116a is separated from a first NMOS transistor 117a in the first direction and the second direction. In yet further embodiments, the second PMOS transistor 116b is separated from the second NMOS transistor 117b in the first direction and the second direction. In further embodiments, the first and second PMOS transistors 116a-116b are respectively separated from the first and second NMOS transistors 117a-117b in the second direction.

A first doped region 118 is disposed in the second semiconductor material layer 106. The first doped region 118 is a regionally continuous region (e.g., shared by multiple devices in a region of the IC 100) that extends through the second semiconductor material layer 106 and underlies the first PMOS transistor 116a and the first NMOS transistor 117a. In various embodiments, the first doped region 118 contacts the insulating layer 108 in a vertical direction beneath the first PMOS transistor 116a and the first NMOS transistor 117a. In some embodiments, the first doped region 118 comprises the second doping type (e.g., n-type doping).

Because the first doped region 118 contacts the insulating layer 108 vertically beneath the first PMOS transistor 116a, the first PMOS transistor 116a comprises a conventional well structure 120, and thus may be a low leakage current MOSFET. On the other hand, because the first doped region 118 contacts the insulating layer 108 vertically beneath the first NMOS transistor 117a, the first NMOS transistor 117a comprises a flip well structure 122, and thus may be a fast switching MOSFET.

A second doped region 124 is disposed in the second semiconductor material layer 106. The second doped region 124 is a continuous region (or regionally continuous region) that extends beneath the first doped region 118 and beyond sides of the first doped region 118. In some embodiments, the second doped region 124 contacts opposing sides of the first doped region 118. In various embodiments, the second doped region 124 contacts the insulating layer 108 in a vertical direction beneath the second PMOS transistor 116b and the second NMOS transistor 117b, while the first doped region 118 separates the second doped region 124 from the insulating layer 108 in a vertical direction beneath the first PMOS transistor 116a and the first NMOS transistor 117a. In some embodiments, the second doped region 124 comprises the first doping type (e.g., p-type doping).

Because the second doped region 124 contacts the insulating layer 108 vertically beneath the second PMOS transistor 116b, the second PMOS transistor 116b comprises a flip well structure 122, and thus may be a fast switching MOSFET. On the other hand, because the second doped region 124 contacts the insulating layer 108 vertically beneath the second NMOS transistor 117b, the second NMOS transistor 117b comprises a conventional well structure 120, and thus may be a low leakage current MOSFET.

Because the first doped region 118 is regionally continuous and the second doped region 124 is continuous (or regionally continuous), the number of individual floating wells on the IC 100 may be reduced. By reducing the number of individual floating wells, the number of body contacts that need to be incorporated in the IC 100 to limit the negative effects associated with floating well may be reduced. Thus, the density of MOSFETs disposed on the IC 100 may be increased. In addition, because the second doped region 124 extends beneath the first doped region 118, such that the the second PMOS transistor 116b and the first NMOS transistor 117a are fast switching MOSFETs and the first PMOS transistor 116a and the second NMOS transistor 117b are low leakage current MOSFETs, the fast switching MOSFETs and the low leakage current MOSFETs do not need to be grouped together. Rather, fast switching MOSFETs and low leakage current MOSFETs may be arranged next to one another. Thus, the power and/or timing of the IC 100 may be improved by taking advantage of the ability to arrange both fast switching MOSFETs and low leakage current MOSFETs next to one another.

Figure 2A:
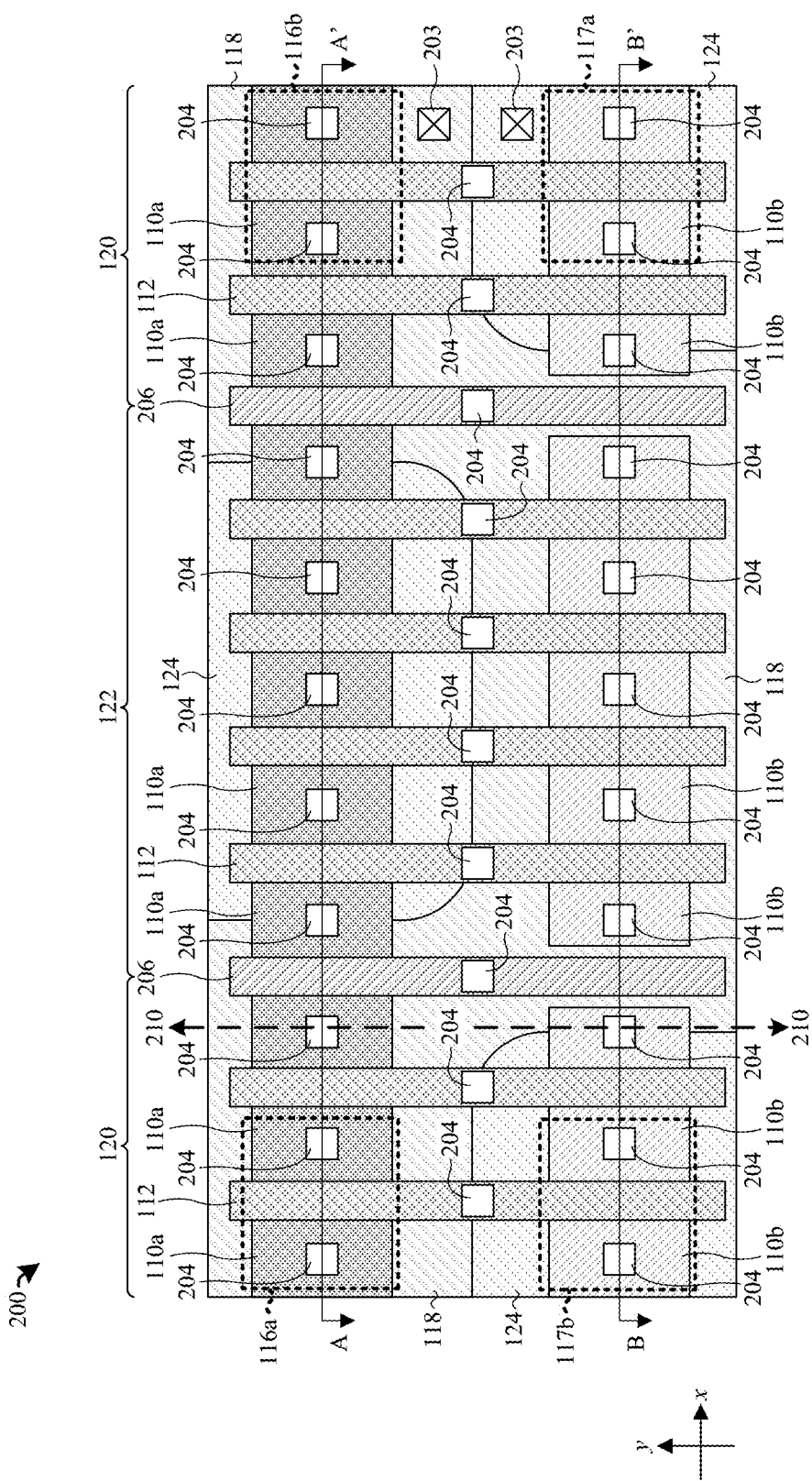
FIGS. 2A-2C illustrate various views of some embodiments of an integrated chip (IC) having multiple doped regions disposed beneath a plurality of gate electrodes arranged over a semiconductor substrate.
Figure 2B:
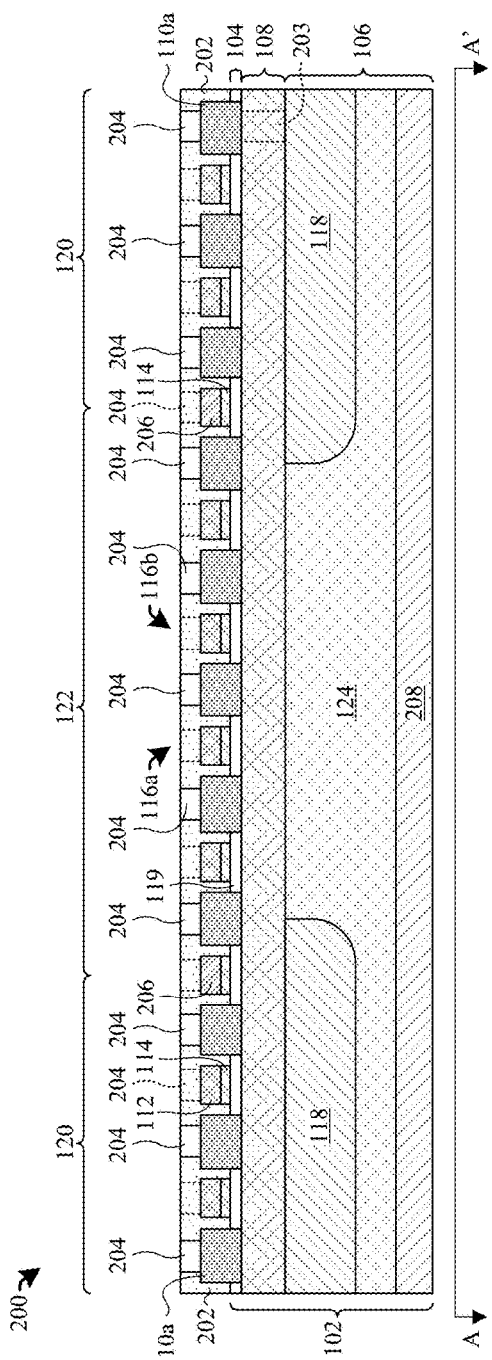
Figure 2C:
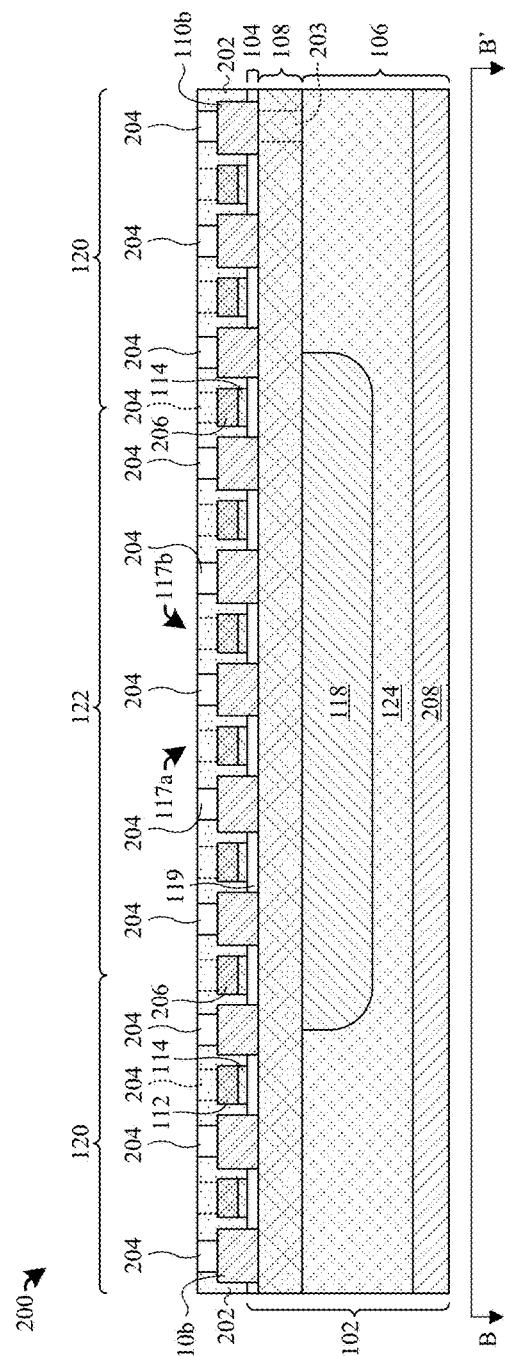

FIGS. 2A-2C illustrate various views of some embodiments of an integrated chip (IC) 200 having multiple doped regions disposed beneath a plurality of gate electrodes arranged over a semiconductor substrate 102. FIG. 2A illustrates a top view of some embodiments of the IC 200. FIG. 2B illustrates a cross-sectional view of some embodiments of a region of the IC 200 taken along line A-A' of FIG. 2A. FIG. 2C illustrates a cross-sectional view of some embodiments of a region of the IC 200 taken along line B-B' of FIG. 2A.

As shown in FIGS. 2A-2C, the first source/drain regions 110a and the second source/drain regions 110b have respective upper surfaces that are disposed above an upper surface of the first semiconductor material layer 104. In some embodiments, the upper surfaces of the first source/drain regions 110a and the second source/drain regions 110b are coplanar with upper surfaces of the gate electrode 112. In further embodiments, the upper surfaces of the first source/drain regions 110a and the second source/drain regions 110b are disposed between the upper surfaces of the gate electrode 112 and the upper surfaces of the first semiconductor material layer 104. In yet further embodiments, the upper surfaces of the first source/drain regions 110a and the second source/drain regions 110b are disposed over an upper surface of the gate electrodes 112.

Isolation gates 206 are disposed over the first semiconductor material layer 104. The isolation gates 206 are configured to reduce leakage between neighboring transistors (e.g., in FIG. 2A, transistors to the left and right of the isolation gates 206). Gate dielectrics 114 respectively underlie the isolation gates 206 and separate the isolation gates 206 from the first semiconductor material layer 104. In various embodiments, individual isolation gates 206 are disposed between a PMOS transistor 116a-116b having a conventional well structure 120 and a neighboring PMOS transistor 116a-116b having a flip well structure 122. In some embodiments, individual isolation gates 206 are disposed between a NMOS transistor 117a-117b having a conventional well structure 120 and a neighboring PMOS transistor 116a-116b having a flip well structure 122. In further embodiments, the isolation gates 206 continuously extend in the second direction between the PMOS transistor 116a-116b having a conventional well structure 120 and the neighboring PMOS transistor 116a-116b having a flip well structure 122 and between the NMOS transistor 117a-117b having a conventional well structure 120 and the neighboring PMOS transistor 116a-116b having a flip well structure 122.

In various embodiments, an individual isolation gate 206 is disposed between closest neighboring first source/drain regions 110a of the PMOS transistor 116a-116b having the conventional well structure 120 and the PMOS transistor 116a-116b having the flip well structure 122, respectively. In some embodiments, an individual isolation gate 206 is disposed between closest neighboring second source/drain regions 110b of the NMOS transistor 117a-117b having the conventional well structure 120 and the NMOS transistor 117a-117b having the flip well structure 122, respectively. In further embodiments, the first doped region 118 contacts the insulating layer 108 in a vertical direction beneath the isolation gates 206. In yet further embodiments, a shallow trench isolation (STI) structure (not shown) may be disposed between closest neighboring first source/drain regions 110a of the PMOS transistor 116a-116b having the conventional well structure 120 and the PMOS transistor 116a-116b having the flip well structure 122, respectively.

An interlayer dielectric (ILD) layer 202 is disposed over the first semiconductor material layer 104, the first source/drain region 110a, the second source/drain regions 110b, the gate electrodes 112, and the isolation gates 206. In various embodiments, the ILD layer 202 separates the first source/drain regions 110a and the second source/drain regions 110b from the gate electrodes 112 and the gate dielectrics 114. In some embodiments, the ILD layer 202 contacts the first semiconductor material layer 104 between sidewalls of the first source/drain regions 110a, sidewalls of the gate electrodes 112, and sidewalls of the gate dielectrics 114, and between sidewalls of the second source/drain regions 110b, sidewalls of the gate electrodes 112, and sidewalls of the gate dielectrics 114. In further embodiments, contacts 204 are disposed in the ILD layer 202 and extend through the ILD layer 202 to respectively contact the first source/drain regions 110a, the second source/drain regions 110b, the gate electrodes 112. In some embodiments, the contacts 204 may further contact the isolation gates 206. In other embodiments, the contacts 204 may not contact the isolation gates 206. The contacts 204 are configured to couple the first source/drain regions 110a, the second source/drain regions 110b, the gate electrodes 112, and the isolation gates 206 to various electric potentials.

Further, body contacts 203 are disposed in the ILD layer 202. The body contacts 203 extend through the ILD layer 202, the first semiconductor material layer 104, and the insulating layer 108 to respectively contact the first doped region 118 and the second doped region 124. The body contacts 203 are configured to respectively couple the first doped region 118 and the second doped region to a first electric potential and a second electric potential. In some embodiments, the second electric potential is less than the first electric potential. In further embodiments, the first electric potential is substantially the same as a positive supply voltage of the IC 200. In yet further embodiments, the second electric potential is substantially the same as a negative supply voltage (or ground) of the IC 200. Because the first doped region 118 is regionally continuous and the second doped region 124 is continuous (or regionally continuous), a reduced number of body contacts 203 may be needed to prevent the first doped region 118 and the second doped region 124 from floating. By reducing the number of body contacts 203, the density of MOSFETs disposed on the IC 200 may be increased.

A third doped region 208 is disposed in the second semiconductor material layer 106. The third doped region 208 is configured to provide isolation between the second doped region 124 and regions of the semiconductor substrate 102 (e.g., regions of the second semiconductor material layer 106 disposed beneath the third doped region 208). The third doped region 208 is a continuous region (or regionally continuous region) that extends beneath the second doped region 124. The second doped region 124 separates the third doped region 208 from the first doped region 118. In some embodiments, the third doped region 208 comprises the second doping type (e.g., n-type doping). In further embodiments, the third doped region 208 may be referred to as a deep well region.

Also shown in FIGS. 2A-2C, some of the first source/drain regions 110a at least partially overlap both the first doped region 118 the second doped region 124 in a vertical direction. In some embodiments, a first source/drain region 110a and a second source/drain region 110b that overlap both the first doped region 118 and the second doped region 124 are arranged in a substantially straight plane 210 that extends in the second direction.

Figure 3A:
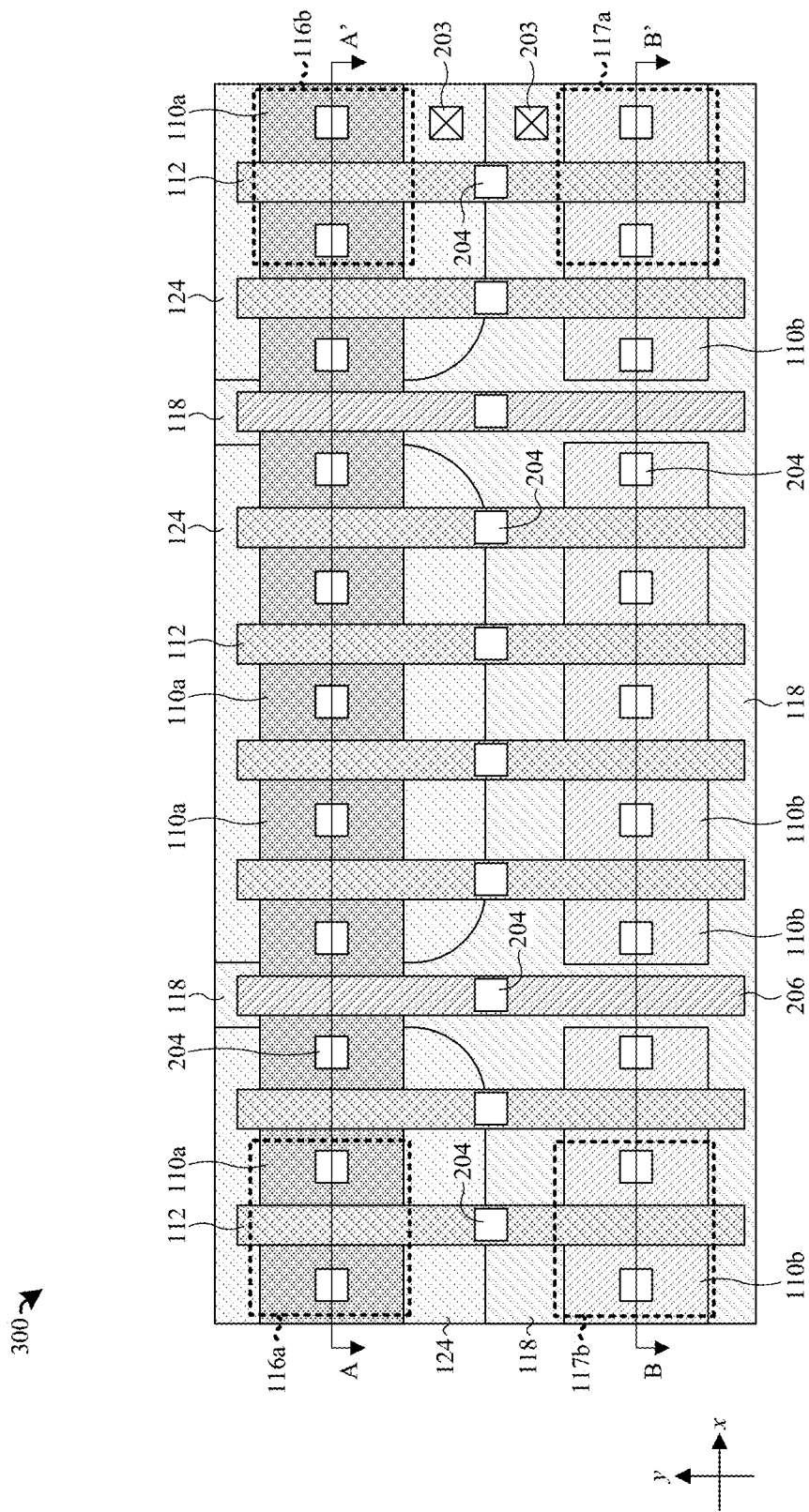

FIGS. 3A-3C illustrate various views of some embodiments of an integrated chip (IC) 300 having multiple doped regions disposed beneath a plurality of gate electrodes arranged over a semiconductor substrate 102. FIG. 3A illustrates a top view of some embodiments of the IC 300. FIG. 3B illustrates a cross-sectional view of some embodiments of a region of the IC 300 taken along line A-A' of FIG. 3A. FIG. 3C illustrates a cross-sectional view of some embodiments of a region of the IC 300 taken along line B-B' of FIG. 3A.

As shown in FIGS. 3A-3C, the first source/drain regions 110a and the second source/drain regions 110b are disposed in the first semiconductor material layer 104 and have upper surfaces coplanar with upper surfaces of the first semiconductor material layer 104. Further, the first doped region 118 extends in the first direction along a substantially straight plane beneath the NMOS transistors 117a-117b. Further, the first doped region 118 comprises protruding portions that extend in the second direction beneath the isolation gates 206. In some embodiments, the first doped region 118 continuously contacts the insulating layer 108 beneath the NMOS transistors 117a-117b and beneath the isolation gates 206. Because the first doped region 118 protrudes beneath the isolation gates 206, the isolation gates 206 may increase electrical isolation between neighboring PMOS transistors 116a-116b by reducing the amount of leakage current between the neighboring PMOS transistors 116a-116b. For example, the isolation gate 206 and the first doped region 118 may be coupled to the first electric potential via respective contacts 204. By applying the first electric potential to both the isolation gate 206 and the first doped region 118, a resistance of a portion of the first semiconductor material layer 104 disposed beneath the isolation gate 206 may be increased.

Also shown in FIGS. 3A-3B, neighboring second source/drain regions 110b disposed on opposite sides of the isolation gates 206 are respectively separated from the isolation gates 206 by a non-zero distance. In various embodiments, neighboring first source/drain regions 110a disposed on opposite sides of the isolation gates 206 have respective sidewalls substantially aligned with sidewalls of the isolation gates 206. In some embodiments, isolation structures (not shown) (e.g., a shallow trench isolation (STI) structures) are disposed in the first semiconductor material layer 104 between the respective second source/drain region 110b that are separated from the isolation gates by a non-zero distance.

FIGS. 4A-4C through 9A-9C illustrate a series of various views of some embodiments of a method for forming an integrated chip (IC) having multiple doped regions disposed beneath a plurality of gate electrodes arranged over a semiconductor substrate. Figures with a suffix of "A" are taken along line A-A' of Figs. with a suffix of "C." Figures with a suffix of "B" are taken along line B-B' of Figs. with a suffix of "C." Figures with a suffix of "C" illustrate various top views of the IC.

Figure 4A:
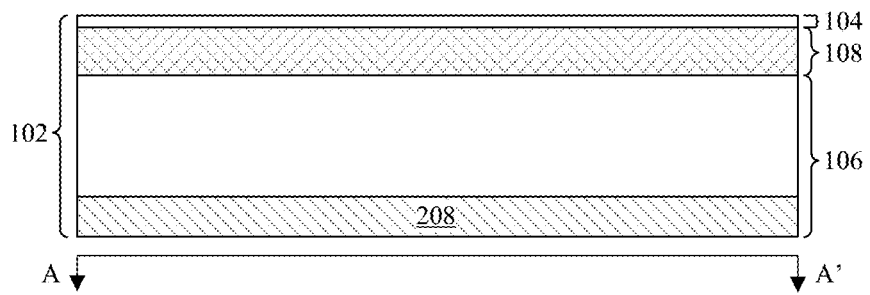
FIGS. 4A-4C through 9A-9C illustrate a series of various views of some embodiments of a method for forming an integrated chip (IC) having multiple doped regions disposed beneath a plurality of gate electrodes arranged over a semiconductor substrate.
Figure 4B:
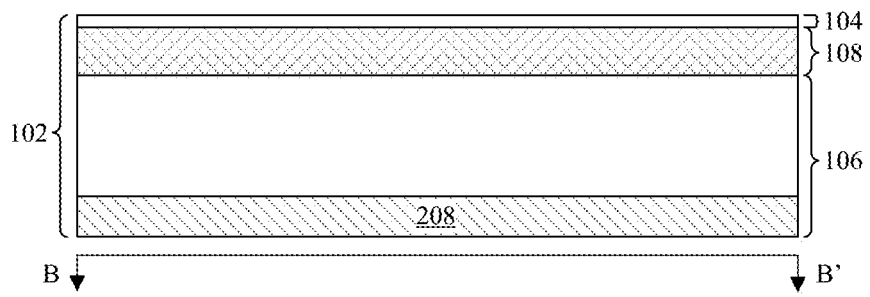
Figure 4C:
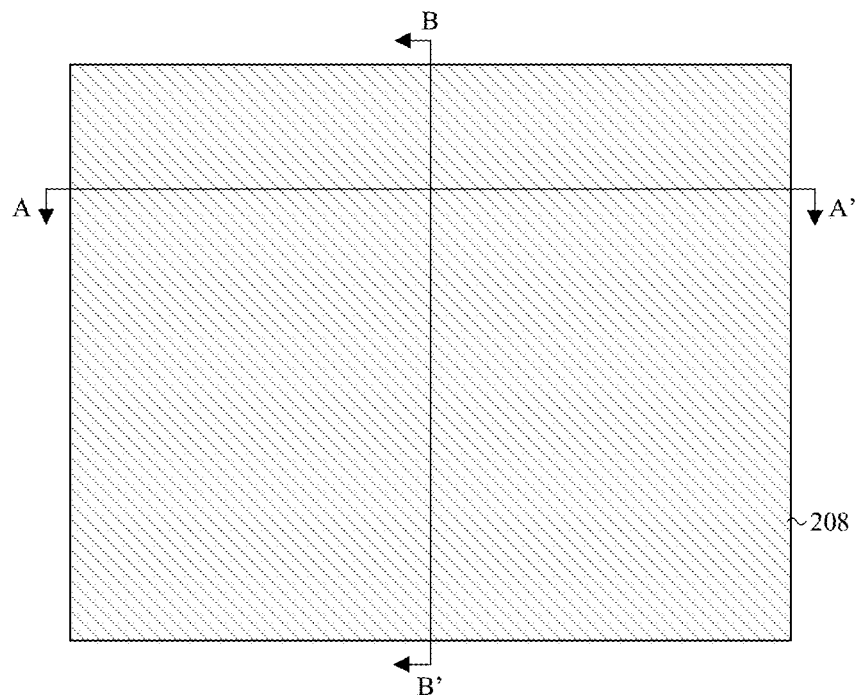

As shown in FIGS. 4A-4C, a third doped region 208 is formed in a semiconductor substrate 102. The third doped region 208 is a region of the semiconductor substrate 102 having a second doping type (e.g., n-type doping). The third doped region 208 is formed in a second semiconductor material layer 106 that is separated from a first semiconductor material layer 104 by an insulating layer 108. In various embodiments, the third doped region 208 may be formed by a blanket ion implantation process (e.g., an unmasked ion implantation) to implant ions into the second semiconductor material layer 106. In other embodiments, the third doped region 208 may be formed by a selective ion implantation process that utilizes a masking layer (not shown) to selectively implant ions into the second semiconductor material layer 106. In further embodiments, the third doped region 208 is formed after active regions (e.g., doped regions disposed in the first semiconductor material layer 104) have been defined in the first semiconductor material layer 104.

Figure 5A:
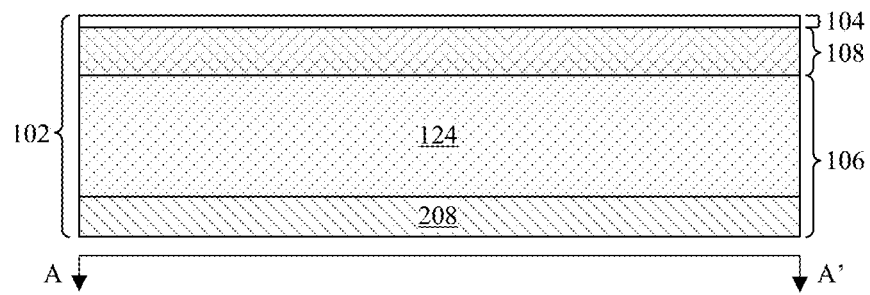
Figure 5B:
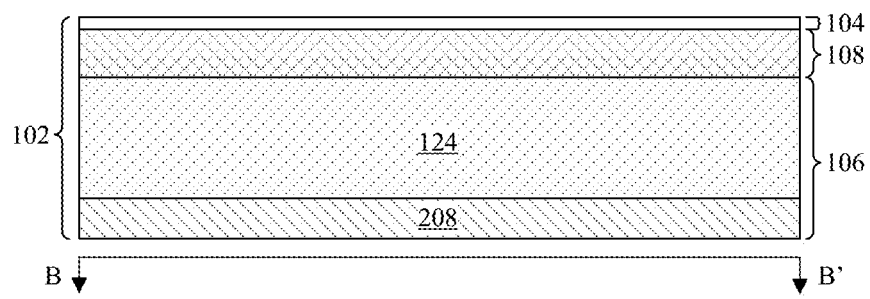
Figure 5C:
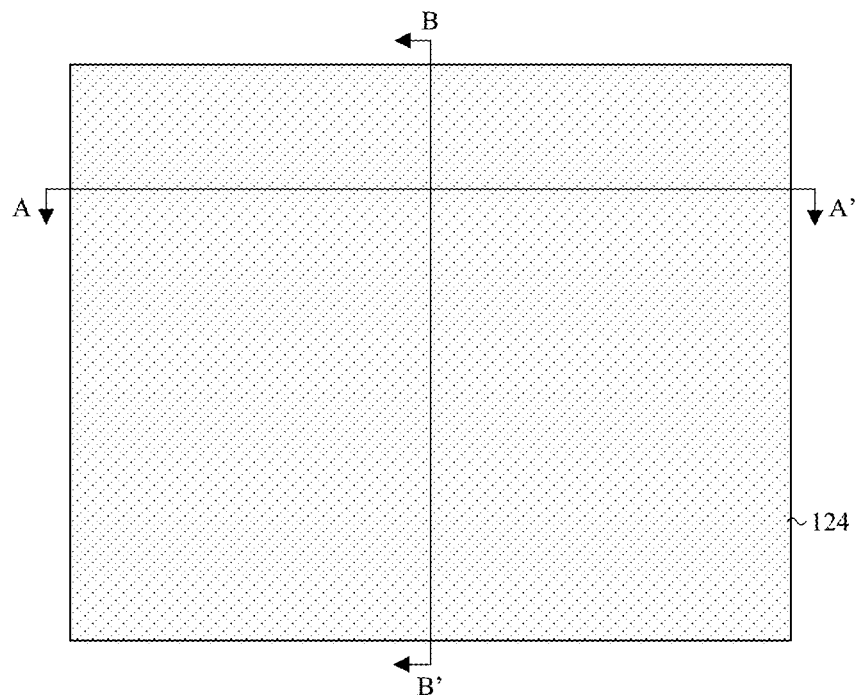

As shown in FIGS. 5A-5C, a second doped region 124 is formed in the second semiconductor material layer 106. The second doped region 124 is a continuous region (or regionally continuous) of the semiconductor substrate 102 having a first doping type (e.g., p-type doping). The second doped region 124 is formed between the insulating layer 108 and the third doped region 208. In some embodiments, the second doped region 124 contacts the insulating layer 108. In various embodiments, the second doped region 124 may be formed by a blanket ion implantation process (e.g., an unmasked ion implantation) to implant ions into the second semiconductor material layer 106. In some embodiments, the second doped region 124 may be formed by a selective ion implantation process that utilizes a masking layer (not shown) to selectively implant ions into the second semiconductor material layer 106. In further embodiments, the second doped region 124 may comprise a doped semiconductor material (e.g., p-typed doped silicon) that was doped during formation of the semiconductor substrate 102.

Figure 6A:
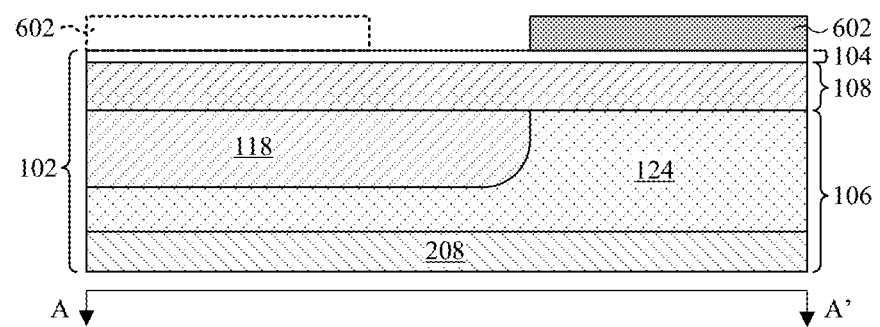
Figure 6B:
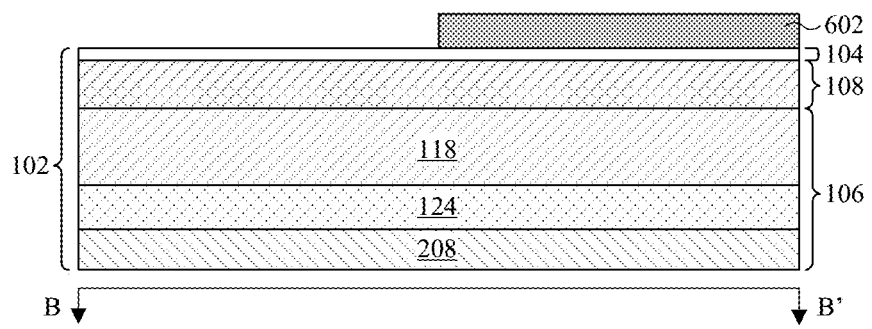
Figure 6C:
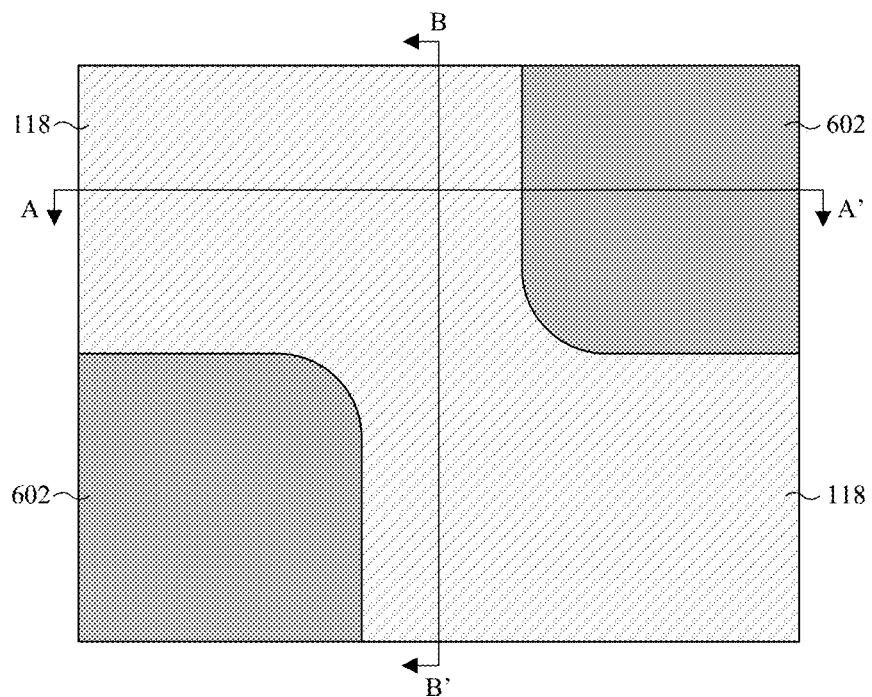

As shown in FIGS. 6A-6C, a first doped region 118 is formed in the second semiconductor material layer 106. The first doped region 118 is a regionally continuous region of the semiconductor substrate 102 having a first doping type (e.g., p-type doping). In some embodiments, the first doped region 118 is formed in the second doped region 124, such that the second doped region 124 extends beneath the first doped region 118 and along opposing sides of the first doped region 118. The first doped region 118 has a first portion and a second portion that are connected by an overlapping portion that extends in between the first portion and the second portion. The first portion, second portion, and overlapping portion of the first doped region 118 separate the second doped region 124 from the insulating layer 108. In some embodiments, the first portion, second portion, and overlapping portion of the first doped region continuously contact the insulating layer 108. In various embodiments, the first doped region 118 may be formed by a selective ion formed implantation process that utilizes a masking layer 602 disposed on the semiconductor substrate 102 to selectively implant ions into regions of the second semiconductor material layer 106 not covered by the masking layer 602. Subsequently, the masking layer 602 may be stripped from the semiconductor substrate 102.

Figure 7A:
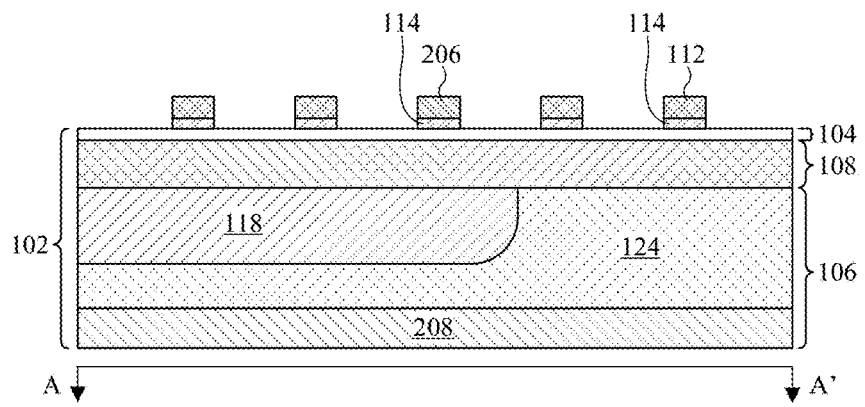
Figure 7B:
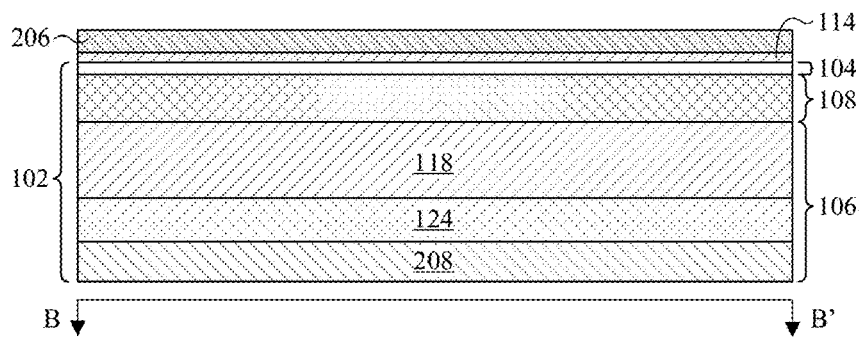
Figure 7C:
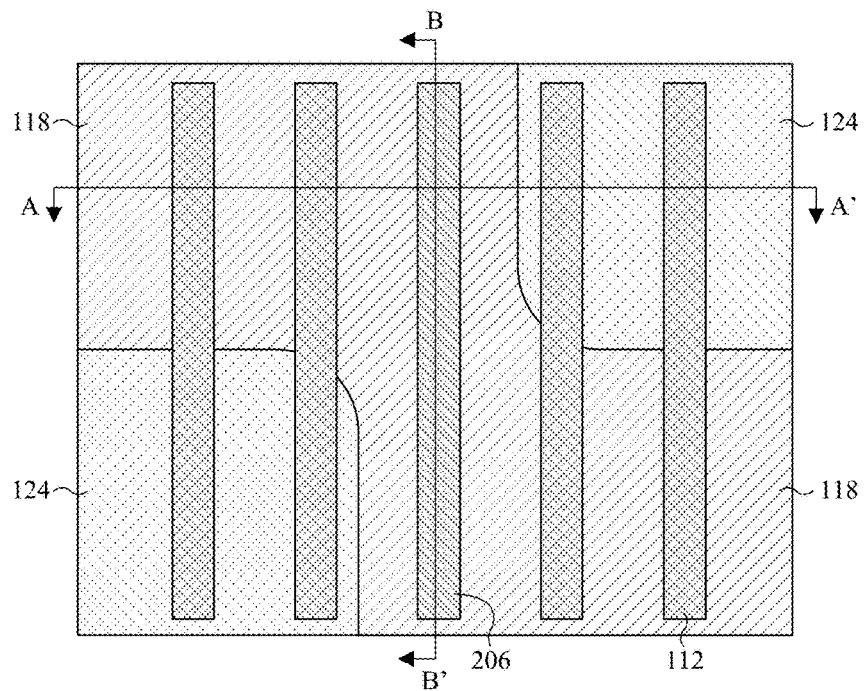

As shown in FIGS. 7A-7C, gate electrodes 112 and an isolation gate 206 are formed over gate dielectrics 114. The gate dielectrics 114 are disposed on the first semiconductor material layer 104 and respectively separate the gate electrodes 112 and the isolation gate 206 from the first semiconductor material layer 104. In various embodiments, the gate electrodes 112 and the isolation gate 206 may comprise, for example, doped polysilicon, tungsten, aluminum, a metal silicide, or some other conductive material. In some embodiments, the gate dielectrics 114 may comprise, for example, an oxide, a high-k dielectric, or some other insulating material.

In various embodiments, the gate electrodes 112, the isolation gate 206, and the gate dielectrics 114 may be formed by growing and/or depositing (e.g., by chemical vapor deposition (CVD), physical vapor deposition (PVD), thermal oxidation, etc.) a gate dielectric layer and a conductive gate layer over the first semiconductor material layer 104. Subsequently, the gate dielectric layer and the conductive gate electrode are patterned and etched to form the gate electrodes 112, the isolation gate 206, and the gate dielectrics 114.

Figure 8A:
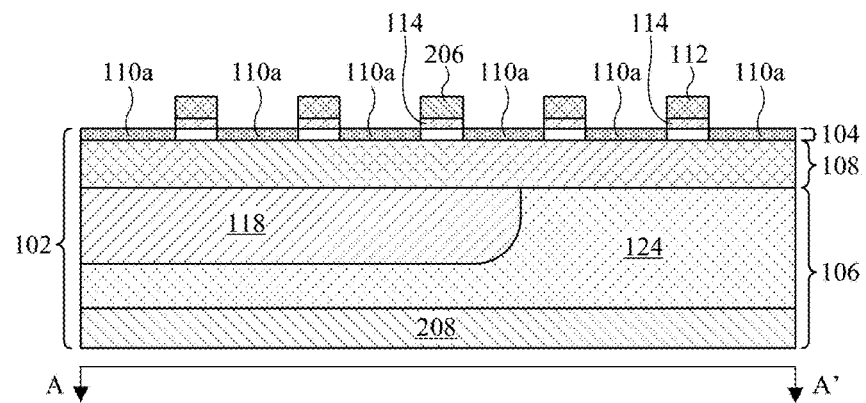
Figure 8B:
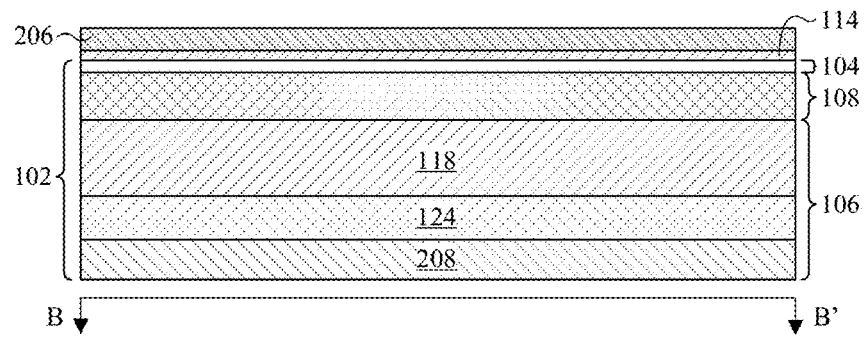
Figure 8C:
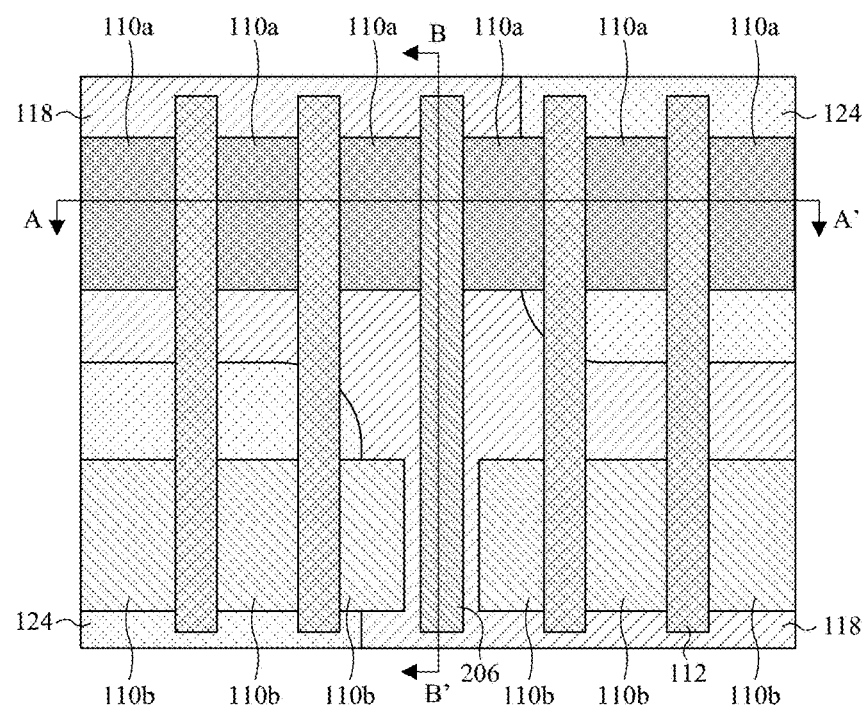

As shown in FIGS. 8A-8C, first source/drain regions 110a and second source/drain regions 110b are formed in the first semiconductor material layer 104. The first source/drain regions 110a are regions of the first semiconductor material layer 104 comprising the first doping type (e.g., p-type doping). The second source/drain regions 110b are regions of the first semiconductor material layer 104 comprising the second doping type (e.g., n-type doping). In various embodiments, the first source/drain regions 110a may be formed by a first ion implantation process and may utilize a masking layer (not shown) to selectively implant ions into the first semiconductor material layer 104. In some embodiments, the second source/drain regions 110b may be formed by a second ion implantation process and may utilize a masking layer (not shown) to selectively implant ions into the first semiconductor material layer 104. In further embodiments, the first source/drain regions 110a or the second source/drain regions 110b may be formed by a self-aligned ion implantation process that utilizes the gate electrodes 112 as a mask.

Figure 9A:
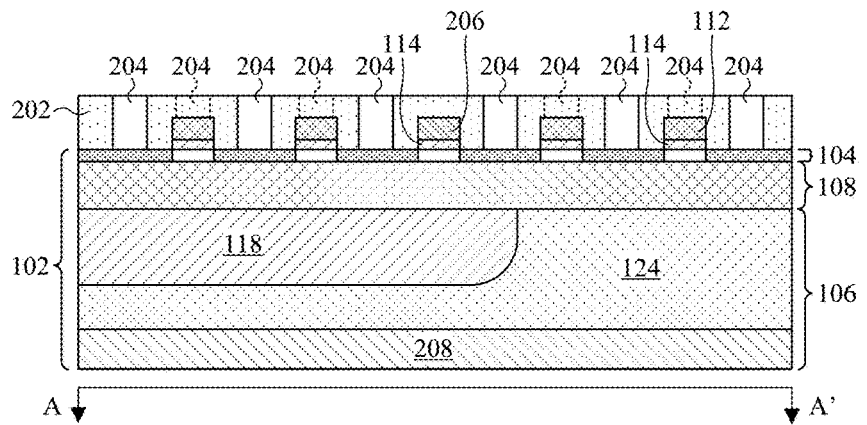
Figure 9B:
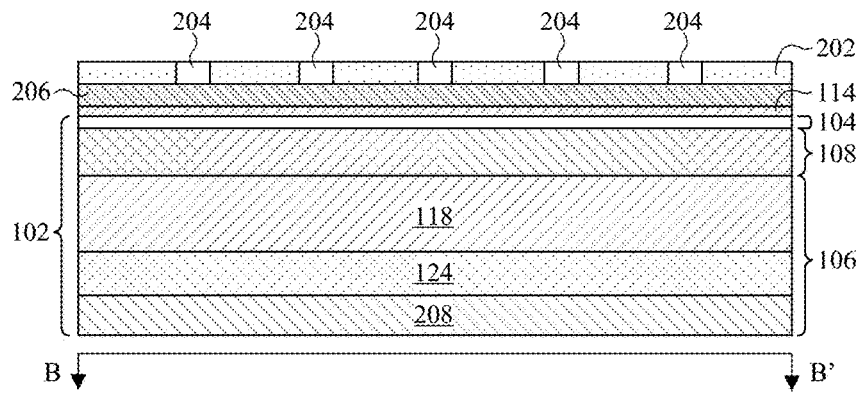
Figure 9C:
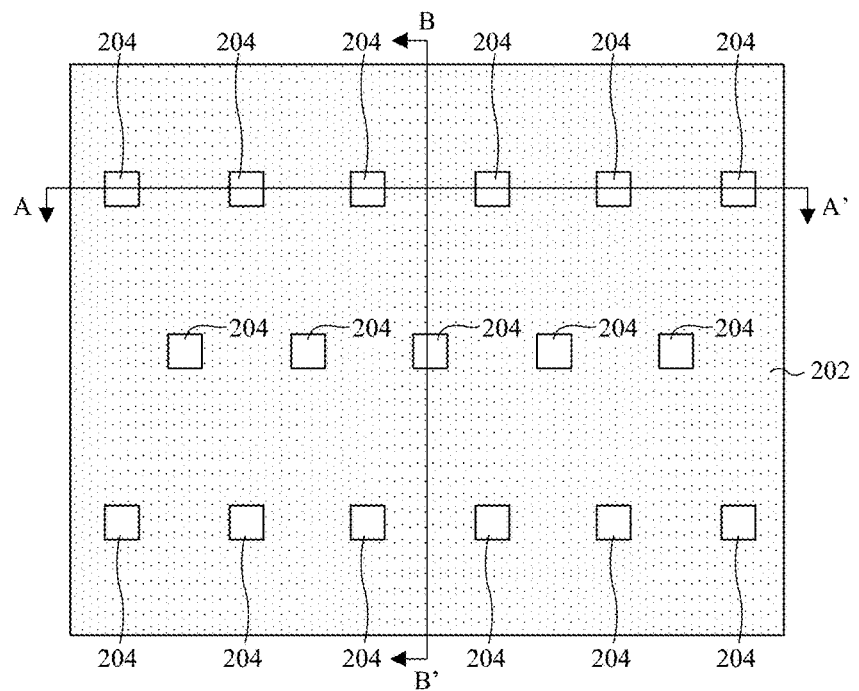

As shown in FIGS. 9A-9C, an interlayer dielectric (ILD) layer 202 is formed over the first semiconductor material layer 104, the first source/drain region 110a, the second source/drain regions 110b, the gate electrodes 112, and the isolation gate 206. The ILD layer 202 may be formed with a substantially planar upper surface and may comprise an oxide, a nitride, a low-k dielectric, or some other dielectric. In some embodiments, the ILD layer 202 may be formed by CVD, PVD, sputtering, or some other deposition or growth process. In further embodiments, a planarization process (e.g., a chemical-mechanical planarization (CMP)) may be performed on the ILD layer 202 to form the substantially planar upper surface.

Also illustrated by FIGS. 9A-9C, contacts 204 are formed in the ILD layer 202 that respectively extend though the ILD layer 202 to the first source/drain regions 110a, the second source/drain regions 110b, the gate electrodes 112, and the isolation gate 206. In some embodiments, a process for forming the contacts 204 comprises performing an etch into the ILD layer 202 to form contact openings that correspond to the contacts 204. In some embodiments, the etch may be performed with a patterned masking layer formed over the ILD layer 202. In further embodiments, the contact openings may be filled by depositing or growing a conductive material (e.g., tungsten) covering the ILD layer 202 that fills the contact openings, and subsequently performing a planarization (e.g., CMP) on the contacts 204 and ILD layer 202.

Although not shown, additional dielectric layers and conductive features may be subsequently formed over the ILD layer 202. For example, one or more additional ILD layers, wires, vias, and/or passivation layers may be formed over the ILD layer 202.

Figure 10:
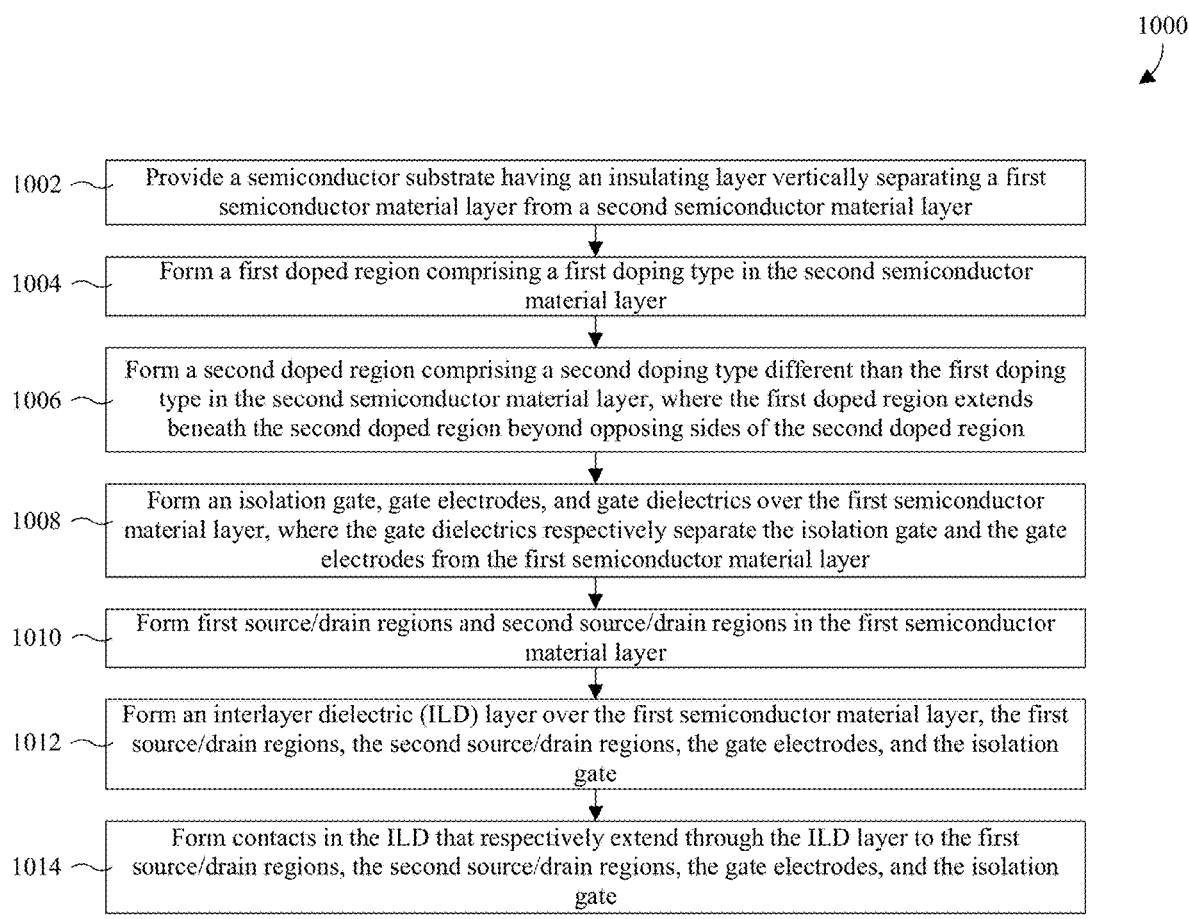
FIG. 10 illustrates a flowchart of some embodiments of a method for forming an integrated chip (IC) having multiple doped regions disposed beneath a plurality of gate electrodes arranged over a semiconductor substrate is provided

As illustrated in FIG. 10, a flowchart 1000 of some embodiments of a method for forming an integrated chip (IC) having multiple doped regions disposed beneath a plurality of gate electrodes arranged over a semiconductor substrate is provided. While the flowchart 1000 of FIG. 10 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 1002, a semiconductor substrate having an insulating layer vertically separating a first semiconductor material layer from a second semiconductor material layer is provided. FIGS. 4A-4C illustrate various views of some embodiments corresponding to act 1002.

At 1004, a first doped region is comprising a first doping type is formed in the second semiconductor material layer. FIGS. 5A-5C illustrate various views of some embodiments corresponding to act 1004.

At 1006, a second doped region comprising a second doping type different than the first doping type is formed in the second semiconductor material layer, where the first doped region extends beneath the second doped region beyond opposing sides of the second doped region. FIGS. 6A-6C illustrate various views of some embodiments corresponding to act 1006.

At 1008, an isolation gate, gate electrodes, and gate dielectrics are formed over the first semiconductor material layer, where the gate dielectrics respectively separate the isolation gate and the gate electrodes form the first semiconductor material layer. FIGS. 7A-7C illustrate various views of some embodiments corresponding to act 1008.

At 1010, first source/drain regions and second source/drain regions are formed in the first semiconductor material layer. FIGS. 8A-8C illustrate various views of some embodiments corresponding to act 1010.

At 1012, an interlayer dielectric (ILD) layer is formed over the first semiconductor material layer, the first source/drain regions, the second source/drain regions, the gate electrodes, and the isolation gate. FIGS. 9A-9C illustrate various views of some embodiments corresponding to act 1012.

At 1014, contacts are formed in the ILD layer that respectively extend through the ILD layer to the first source/drain regions, the second source/drain regions, the gate electrodes, and the isolation gate. FIGS. 9A-9C illustrate various views of some embodiments corresponding to act 1014.

In some embodiments, the present application provides a semiconductor device. The semiconductor device includes a first semiconductor material layer separated from a second semiconductor material layer by an insulating layer. A first source region and a first drain region are disposed in the first semiconductor material layer, where the first source region is spaced from the first drain region in a first direction. A gate electrode is disposed over the first semiconductor material layer between the first source region and the first drain region. A first doped region having a first doping type is disposed in the second semiconductor material layer, where the gate electrode directly overlies the first doped region. A second doped region having a second doping type different than the first doping type is disposed in the second semiconductor material layer. The second doped region extends in the first direction beneath the first doped region and contacts opposing sides of the first doped region.

In other embodiments, the present application provides a method for forming a semiconductor device. A semiconductor substrate having an insulating layer vertically separating a first semiconductor material layer from a second semiconductor material layer is provided. A first well having a first doping type is formed in the second semiconductor material layer. A second well having a second doping type different than the first doping type is formed in the first well, where the first well extends beneath the second well beyond opposing sides of the second well. A first pair of source/drain regions are formed in the first semiconductor material layer. A first gate electrode is formed over the first semiconductor material layer between the first source/drain regions. A second pair of source/drain regions laterally spaced from the first pair of source/drain regions are formed in the first semiconductor material layer. A second gate electrode is formed over the first semiconductor material layer between the second source/drain regions. The first well laterally extends beneath the first gate electrode and the second gate electrode. One of the opposing sides of the second well is disposed between the first gate electrode and the second gate electrode.

In yet other embodiments, the present application provides a semiconductor device. The semiconductor device includes a semiconductor substrate having a first semiconductor material layer vertically separated from a second semiconductor material layer by an insulating layer. A first gate electrode is disposed over the first semiconductor material layer and between first source/drain regions. A second gate electrode is disposed over the first semiconductor material layer and between second source/drain regions. A third gate electrode is disposed over the first semiconductor material layer and between third source/drain regions. A first doped region having a first doping type is disposed in the second semiconductor material layer. The first doped region contacts the insulating layer vertically beneath the first gate electrode and continuously extends through the second semiconductor material layer to contact the insulating layer vertically beneath the third gate electrode. A second doped region having a second doping type different than the first doping type is disposed in the second semiconductor material layer. The second doped region contacts the insulating layer vertically beneath the second gate electrode. The second doped region continuously extends beneath the first, second, and third gate electrodes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, the method comprising:
   receiving a semiconductor substrate having an insulating layer vertically separating a first semiconductor material layer from a second semiconductor material layer, wherein a first doped region having a first doping type is disposed in the second semiconductor material layer;
   forming a second doped region having a second doping type opposite the first doping type in the first doped region;
   forming a first gate electrode over the first semiconductor material layer, wherein the first gate electrode extends laterally in a first direction, such that a first portion of the second doped region contacts the insulating layer directly beneath a first portion of the first gate electrode and a first portion of the first doped region contacts the insulating layer directly beneath a second portion of the first gate electrode;
   forming a pair of first source/drain regions in the first semiconductor material layer and on opposite sides of the first portion of the first gate electrode, wherein the first source/drain regions are spaced apart in a second direction transverse the first direction; and
   forming a pair of second source/drain regions in the first semiconductor material layer and on opposite sides of the second portion of the first gate electrode, wherein the second source/drain regions are spaced from the first source/drain regions in the first direction, and wherein the second source/drain regions are spaced apart in the second direction.

2. The method of claim 1, wherein the first source/drain regions are formed directly over the first portion of the second doped region.

3. The method of claim 2, wherein the second source/drain regions are formed directly over the first portion of the first doped region.

4. The method of claim 3, wherein the first portion of the second doped region is disposed vertically between the first source/drain regions and the first doped region.

5. The method of claim 1, further comprising:
   forming a second gate electrode over the first semiconductor material layer and spaced from the first gate electrode in the second direction, wherein the second gate electrode extends laterally in the first direction, such that a second portion of the first doped region contacts the insulating layer directly beneath a first portion of the second gate electrode and a second portion of the second doped region contacts the insulating layer directly beneath a second portion of the second gate electrode;
   forming a pair of third source/drain regions in the first semiconductor material layer and on opposite sides of the first portion of the second gate electrode, wherein the third source/drain regions are spaced from both the first source/drain regions and the second source/drain regions in the second direction; and
   forming a pair of fourth source/drain regions in the first semiconductor material layer and on opposite sides of the second portion of the second gate electrode, wherein the fourth source/drain regions are spaced from both the first source/drain regions and the second source/drain regions in the second direction, and wherein the fourth source/drain regions are spaced from the third source/drain regions in the first direction.

6. The method of claim 5, wherein a third portion of the second doped region extends continuously along the insulating layer from the first portion of the second doped region to the second portion of the second doped region.

7. The method of claim 6, wherein a third portion of the first doped region extends from the first portion of the first doped region to the second portion of the first doped region by extending beneath the third portion of the second doped region.

8. The method of claim 7, wherein:
   the first source/drain regions have the first doping type;
   the second source/drain regions have the second doping type;
   the third source/drain regions have the first doping type; and
   the fourth source/drain regions have the second doping type.

9. The method of claim 8, wherein:
   the first portion of the second doped region is disposed vertically between the first source/drain regions and the first doped region; and
   the second portion of the second doped region is disposed vertically between the fourth source/drain regions and the first doped region.

10. A method for forming a semiconductor device, the method comprising:
    receiving a semiconductor substrate having an insulating layer vertically separating a first semiconductor material layer from a second semiconductor material layer, wherein a first well having a first doping type is disposed in the second semiconductor material layer;
    forming a second well comprising a second doping type different than the first doping type in the first well, wherein the second well is a continuous well, and wherein the first well is a continuous well that extends beneath the second well;
    forming a first gate electrode over the first semiconductor material layer;
    forming a second gate electrode over the first semiconductor material layer and spaced from the first gate electrode in a first direction;
    forming a pair of first source/drain regions in the first semiconductor material layer and on opposite sides of a first portion of the first gate electrode, wherein the second well contacts the insulating layer directly below the first source/drain regions;

forming a pair of second source/drain regions in the first semiconductor material layer and on opposite sides of a second portion of the first gate electrode, wherein the second source/drain regions are spaced from the first source/drain regions in a second direction transverse the first direction, and wherein the first well contacts the insulating layer directly below the second source/drain regions; and forming a pair of third source/drain regions in the first semiconductor material layer and on opposite sides of a first portion of the second gate electrode, wherein the third source/drain regions are spaced from both the first source/drain regions and the second source/drain regions in the first direction, and wherein the first well contacts the insulating layer directly below the third source/drain regions.

11. The method of claim 10, wherein the first source/drain regions and the third source/drain regions are substantially aligned along a first plane that extends in the first direction.

12. The method of claim 11, further comprising:
forming a pair of fourth source/drain regions in the first semiconductor material layer and on opposite sides of a second portion of the second gate electrode, wherein:
the fourth source/drain regions are spaced from both the first source/drain regions and the second source/drain regions in the first direction;
the fourth source/drain regions are spaced from the third source/drain regions in the second direction; and
the second well contacts the insulating layer directly below the fourth source/drain regions.

13. The method of claim 12, wherein:
the second source/drain regions and the fourth source/drain regions are substantially aligned along a second plane that extends in the first direction; and
the second plane is spaced from the first plane in the second direction.

14. The method of claim 13, wherein:
the first source/drain regions comprise the first doping type;
the second source/drain regions comprise the second doping type;
the third source/drain regions comprise the first doping type; and
the fourth source/drain regions comprise the second doping type.

15. The method of claim 14, further comprising:
forming a first body contact that extends through both the first semiconductor material layer and the insulating layer to the first well; and
forming a second body contact that extends through both the first semiconductor material layer and the insulating layer to the second well.

16. The method of claim 14, further comprising:
before the first source/drain regions are formed, forming an isolation gate over the first semiconductor material layer and between the first gate electrode and the second gate electrode, wherein:
the first gate electrode, the second gate electrode, and the isolation gate extend in the second direction in parallel with one another;
the second well continuously contacts the insulating layer directly below the isolation gate from a first sidewall of the isolation gate to a second sidewall of the isolation gate; and
the first sidewall and the second sidewall are spaced apart in the second direction.

17. A method for forming a semiconductor device, the method comprising:
receiving a semiconductor substrate having an insulating layer vertically separating a first semiconductor material layer from a second semiconductor material layer;
forming a first doped region having a first doping type in the second semiconductor material layer;
forming a second doped region having a second doping type different than the first doping type in the first doped region, wherein the second doped region is continuous, and wherein the first doped region is continuous and extends beneath the second doped region;
forming a first gate electrode over the first semiconductor material layer, wherein the first gate electrode extends laterally in a first direction, such that a first portion of the second doped region contacts the insulating layer directly beneath a first portion of the first gate electrode and a first portion of the first doped region contacts the insulating layer directly beneath a second portion of the first gate electrode;
forming a second gate electrode over the first semiconductor material layer and spaced from the first gate electrode in a second direction transverse the first direction, wherein the second gate electrode extends laterally in the first direction and in parallel with the first gate electrode, such that a second portion of the second doped region contacts the insulating layer directly beneath a first portion of the second gate electrode and a second portion of the first doped region contacts the insulating layer directly beneath a second portion of the second gate electrode; and
forming an isolation gate over the first semiconductor material layer and between the first gate electrode and the second gate electrode, wherein:
the isolation gate extends laterally in the first direction and in parallel with the second gate electrode;
a third portion of the second doped region contacts the insulating layer directly beneath the isolation gate from a first sidewall of the isolation gate to a second sidewall of the isolation gate; and
the first sidewall and the second sidewall are spaced apart in the first direction.

18. The method of claim 17, wherein:
the first gate electrode has a third sidewall and a fourth sidewall that are spaced apart in the first direction;
the second gate electrode has a fifth sidewall and a sixth sidewall that are spaced apart in the first direction;
the first sidewall, the third sidewall, and the fifth sidewall are substantially aligned along a first plane that extends in the second direction; and
the second sidewall, the fourth sidewall, and the sixth sidewall are substantially aligned along a second plane that extends in the second direction and in parallel with the first plane.

19. The method of claim 17, further comprising:
forming a pair of first source/drain regions having the second doping type in the first semiconductor material layer and on opposite sides of the first portion of the first gate electrode, wherein the first source/drain regions are spaced apart in the second direction;
forming a pair of second source/drain regions having the first doping type in the first semiconductor material layer and on opposite sides of the second portion of the first gate electrode, wherein the second source/drain regions are spaced apart in the second direction;
forming a pair of third source/drain regions having the second doping type in the first semiconductor material layer and on opposite sides of the first portion of the second gate electrode, wherein the third source/drain regions are spaced apart in the second direction, and wherein the first source/drain regions and the second source/drain regions are substantially aligned along a first plane that extends in the second direction; and forming a pair of fourth source/drain regions having the first doping type in the first semiconductor material layer and on opposite sides of the second portion of the second gate electrode, wherein the fourth source/drain regions are spaced apart in the second direction, wherein the second source/drain regions and the fourth source/drain regions are substantially aligned along a second plane that extends in the second direction and is spaced from the first plane in the first direction.

20. The method of claim 19, further comprising:

before the first doped region is formed, forming a third doped region having the second doping type in the second semiconductor material layer, wherein the third doped region extends beneath both the first doped region and the second doped region.

* * * * *